(12) United States Patent
Enriquez Shibayama et al.

(10) Patent No.: US 9,589,919 B2
(45) Date of Patent: Mar. 7, 2017

(54) INTERCONNECT ARRANGEMENT FOR HEXAGONAL ATTACHMENT CONFIGURATIONS

(75) Inventors: Raul Enriquez Shibayama, Zapopan (MX); Jimmy A. Johansson, Guadalajara (MX); Kai Xiao, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 13/993,334

(22) PCT Filed: Dec. 22, 2011

(86) PCT No.: PCT/US2011/066767
§ 371 (c)(1),
(2), (4) Date: Feb. 5, 2014

(87) PCT Pub. No.: WO2013/095492
PCT Pub. Date: Jun. 27, 2013

(65) Prior Publication Data
US 2014/0140027 A1    May 22, 2014

(51) Int. Cl.
*H05K 1/00*    (2006.01)
*H01L 23/00*    (2006.01)
(Continued)

(52) U.S. Cl.
CPC ........ *H01L 24/06* (2013.01); *H01L 23/49811* (2013.01); *H01L 23/49838* (2013.01);
(Continued)

(58) Field of Classification Search
CPC . H01L 2924/01079; H01L 2924/01078; H01L 24/50; H01L 2224/141;
(Continued)

(56) References Cited

U.S. PATENT DOCUMENTS 4,912,603 A * 3/1990 Seyama .............. H01L 23/5384
174/261
5,939,782 A * 8/1999 Malladi ................. H01L 23/642
257/698

(Continued)

FOREIGN PATENT DOCUMENTS

TW    200627733 A    8/2006
WO    2013/095492 A1    6/2013

OTHER PUBLICATIONS

Office Action received for Taiwan Patent Application No. 101148352, mailed on Aug. 20, 2014, 13 Pages of Office Action and 15 Pages of English Translation.
(Continued)

*Primary Examiner* — Angel R Estrada
*Assistant Examiner* — Pete Lee
(74) *Attorney, Agent, or Firm* — Blakely, Sokoloff, Taylor & Zafman LLP

(57) ABSTRACT

The present description relates to the field of fabricating microelectronic devices, wherein a microelectronic device may have a hexagonal confirmation for signal nodes and ground nodes which utilizes the cross-talk reduction by cancellation property of geometrically symmetry and orthogonality to reduce signal node to ground node ratio for increasing signaling density.

12 Claims, 6 Drawing Sheets

(51) Int. Cl.
*H01L 23/498* (2006.01)
*H05K 1/02* (2006.01)
*H05K 1/11* (2006.01)
*H05K 3/34* (2006.01)

(52) U.S. Cl.
CPC .............. *H01L 24/14* (2013.01); *H01L 24/17* (2013.01); *H05K 1/0228* (2013.01); *H01L 24/13* (2013.01); *H01L 24/16* (2013.01); *H01L 24/81* (2013.01); *H01L 2223/6638* (2013.01); *H01L 2224/0401* (2013.01); *H01L 2224/12105* (2013.01); *H01L 2224/13111* (2013.01); *H01L 2224/13116* (2013.01); *H01L 2224/16225* (2013.01); *H01L 2224/17515* (2013.01); *H01L 2224/81815* (2013.01); *H01L 2924/01322* (2013.01); *H01L 2924/15311* (2013.01); *H05K 1/0245* (2013.01); *H05K 1/111* (2013.01); *H05K 3/3436* (2013.01); *H05K 2201/09418* (2013.01); *H05K 2201/10189* (2013.01); *H05K 2201/10734* (2013.01)

(58) Field of Classification Search
CPC ......... H01L 2224/161; H01L 2224/171; H01L 2224/211; H01L 2224/221; H01L 2224/2902; H01L 2224/301; H01L 2224/321; H01L 2224/331; H01L 2224/3702; H01L 2224/401; H01L 2224/411; H01L 2224/4502; H01L 2224/481; H01L 23/49838; H01L 23/485; H01L 2224/10; H01L 24/10; H01L 2224/16055; H01L 23/4821; H01L 23/5221; H01L 23/5381; H01L 2225/06517; H01L 2225/06513; H05K 3/28; H05K 1/09; H05K 1/092; H05K 1/095; H05K 1/097; H05K 2201/0133; H05K 2201/02; H05K 2201/0203; H05K 2201/0206; H05K 2201/0209; H05K 2201/0212; H05K 2201/0215; H05K 2201/0218; H05K 2201/0221; H05K 2201/0224; H05K 2201/0227; H05K 2201/023; H05K 2201/0233; H05K 2201/0236; H05K 2201/0239; H05K 2201/0272; H05K 2201/0323; H05K 2201/0326; H05K 2201/0329; H05K 2201/051; H05K 1/0277; H05K 1/0278; H05K 1/028; H05K 1/0393; H05K 1/118; H05K 1/147; H05K 1/148; H05K 1/189; H05K 2201/042; H05K 2201/046; H05K 2201/0332; H05K 1/00; H01R 13/6467

USPC .......... 174/250–265; 257/778, 786, 738, 776, 257/737

See application file for complete search history.

(56) References Cited

U.S. PATENT DOCUMENTS

| | | | |
|---|---|---|---|
| 6,285,079 | B1 | 9/2001 | Kunikiyo |
| 6,323,559 | B1* | 11/2001 | Chan et al. .................. 257/778 |
| 2003/0133276 | A1* | 7/2003 | Zhong ............... H01L 23/49811 361/768 |
| 2005/0186769 | A1* | 8/2005 | Young ............... H01L 23/49816 438/612 |
| 2005/0196987 | A1 | 9/2005 | Shuey |
| 2005/0280137 | A1 | 12/2005 | Cornelius |
| 2009/0294152 | A1 | 12/2009 | Lin |
| 2013/0105987 | A1* | 5/2013 | Gallegos ............... H05K 1/0222 257/774 |
| 2013/0134579 | A1* | 5/2013 | Howard .................. H01L 24/49 257/737 |

OTHER PUBLICATIONS

International Preliminary Report on Patentability and Written Opinion received for PCT Patent Application No. PCT/US2011/066767, mailed on Jul. 3, 2014, 6 pages.

International Search Report and Written Opinion Received for PCT Patent Application No. PCT/US2011/066767, Mailed on Sep. 20, 2012, 9 pages.

\* cited by examiner

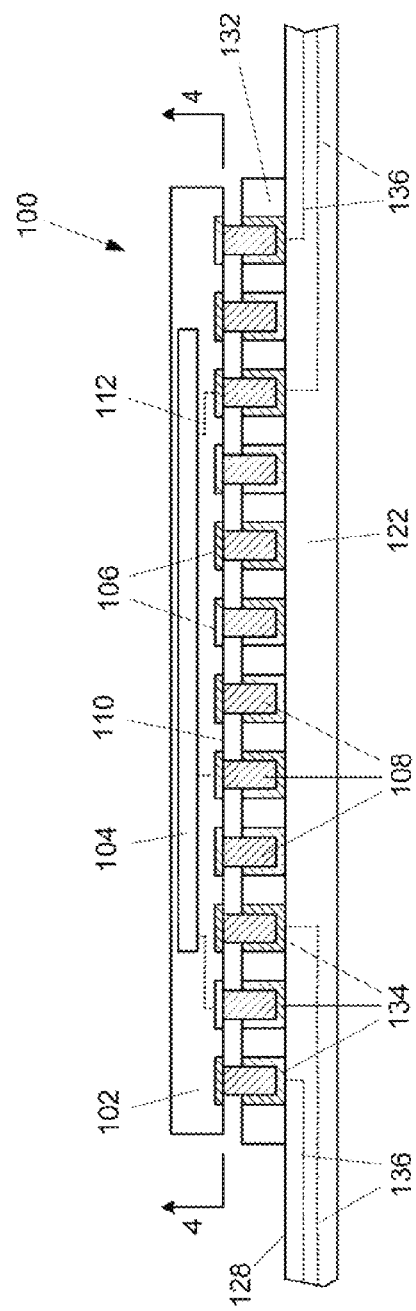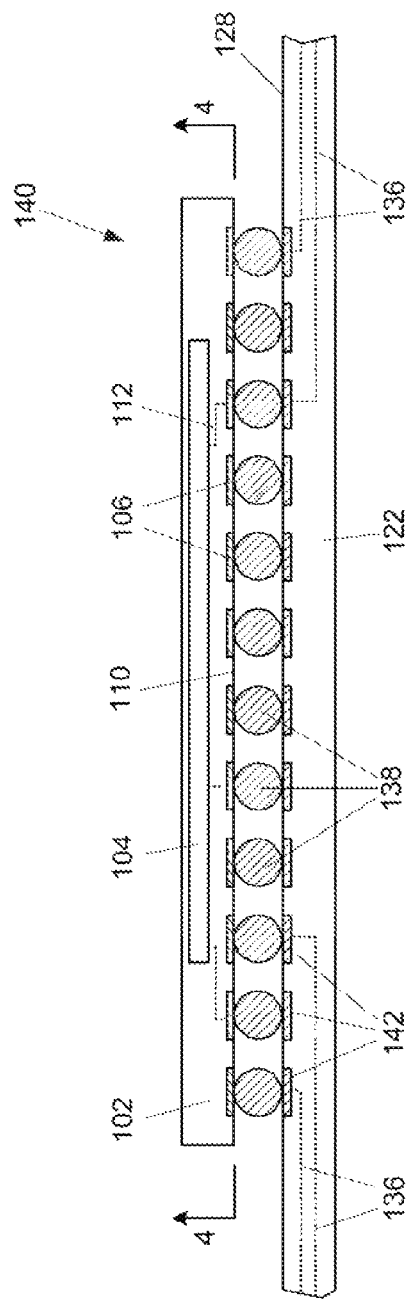

INTERCONNECT ARRANGEMENT FOR HEXAGONAL ATTACHMENT CONFIGURATIONS

BACKGROUND

Embodiments of the present description generally relate to the field of microelectronic devices and, more particularly, to the mapping of interconnections for the electrical attachment of microelectronic devices to microelectronic substrates.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIG. 1 is a side cross-sectional view of a microelectronic assembly including a microelectronic device mounted on a microelectronic substrate with a microelectronic socket.

FIG. 2 is a side cross-sectional view of a microelectronic assembly including a microelectronic device mounted on a microelectronic substrate with solder bumps.

DETAILED DESCRIPTION

Figure 3:
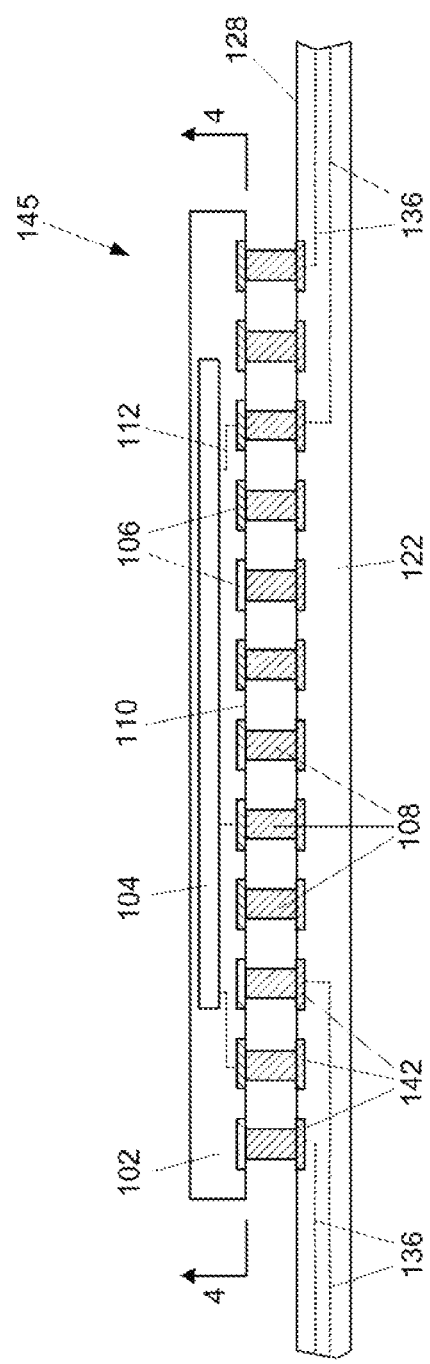
FIG. 3 is a side cross-sectional view of a microelectronic assembly including a microelectronic device mounted on a microelectronic substrate.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic devices, wherein a microelectronic device may have a hexagonal confirmation for signal nodes and ground nodes which utilizes the cross-talk reduction by cancellation property of geometrically symmetry and orthogonality to reduce signal node to ground node ratio for increasing signaling density.

In the production of microelectronic assemblies, microelectronic devices are generally mounted on microelectronic substrates, which provide electrical communication routes between the microelectronic devices and external components. As shown in FIG. 1, a microelectronic assembly 100 may comprise a microelectronic device 102 attached to a microelectronic substrate 122. The microelectronic device 102 may be any appropriate device, such as a packaged microelectronic die 104 (e.g. a microprocessor, a chipset, a graphics device, a wireless device, a memory device, an application specific integrated circuit, or the like), and may be a bare microelectronic die. The microelectronic die 104 may be packaged in any manner known in the art. The microelectronic substrate 122 may be any appropriate substrate, such as an interposer, a printed circuit board, and the like, and may be primarily composed of an appropriate material, including, but not limited to, bismaleimine triazine resin, fire retardant grade 4 material, polyimide materials, glass reinforced epoxy matrix material, and the like, as well as laminates or multiple layers thereof. It is understood that the microelectronic device 102 may also be another microelectronic substrate, such as described for the microelectronic substrate 122 or any other appropriate device for attachment to the microelectronic substrate 112.

A plurality of interconnects, such as pins 108, may extend from bond pads or vias 106 on a land side 110 of the microelectronic device 102. The microelectronic device vias 106 may be in electrical communication with the microelectronic die 104 through conductive routes (shown as dashed lines 112). The interconnect pins 108 may be inserted into conductive recesses 134 within a microelectronic socket 132, wherein the microelectronic socket 132 may be attached to the microelectronic substrate 122 and the microelectronic socket conductive recesses 134 may be in electrical communication with external components (not shown) through conductive routes (shown as dashed lines 136) on or within the microelectronic substrate 122. The microelectronic device vias 106, the interconnect pins 108, the microelectronic socket conductive recesses 134, the microelectronic device conductive routes 112, and the microelectronic substrate conductive routes 136 may be composed of any conductive material, including but not limited to metals, such as copper and aluminum, and alloys thereof. As will be understood to those skilled in the art, the microelectronic device conductive routes 112 and the microelectronic substrate conductive routes 136 may be formed as a plurality of conductive traces (not shown) formed on layers of dielectric material (constituting the layers of the microelectronic substrate material), which are connected by conductive vias (not shown).

In another embodiment of the present description as shown in FIG. 2, a microelectronic assembly 140 may include the microelectronic device 102 attached to the microelectronic substrate 122 through a plurality of solder bump interconnects 138 extending between the microelectronic device vias 106 and mirror-image bond pads or vias 126 on an attachment surface 128 of the microelectronic substrate 122. The solder bump interconnects 138 can be made any appropriate material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic device 102 is attached to the microelectronic substrate 122, the solder bump interconnects 138 may be reflowed, either by heat, pressure, and/or sonic energy to secure the solder bump interconnects 138 between their respective microelectronic device bond pads 106 and the microelectronic substrate vias 142.

Figure 4:
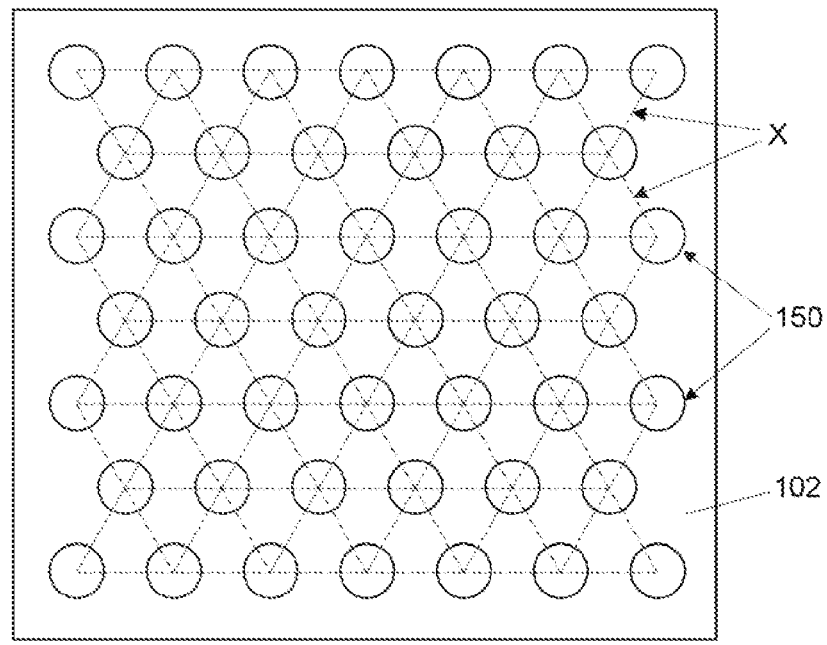
FIG. 4 is a bottom plan view of the microelectronic structure of FIG. 1, 2, or 3 along line 4-4.
Figure 5:
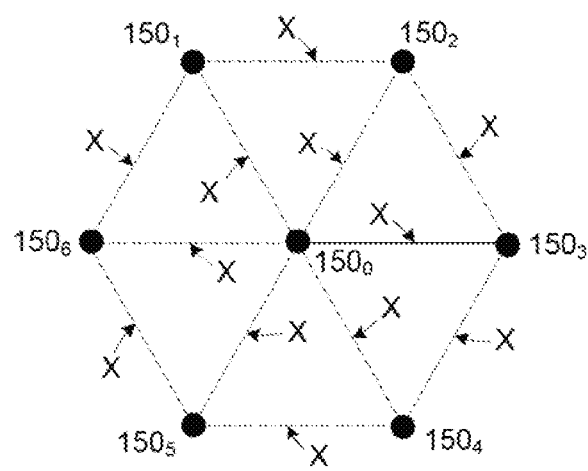
FIG. 5 is a schematic of a hexagonal configuration.

In another embodiment of the present description as shown in FIG. 3, a microelectronic assembly 145 may include the microelectronic device 102 in electrical contact with the microelectronic substrate 122 through a plurality of pillar interconnects 146 extending between the microelectronic device vias 106 and mirror-image bond pads or vias 126 on an attachment surface 128 of the microelectronic substrate 122. The pillar interconnects 142 may be attached to the microelectronic device vias 106 and may be held against the microelectronic substrate vias 142 by pressure, such as by a retention mechanism (not shown). As shown in FIGS. 4 and 5, the microelectronic device vias 106, the microelectronic substrate vias 142, and/or the socket conductive recesses 138 may be configured in a hexagonal arrangement to maximize the density of interconnects (e.g. interconnect pins 108 of FIG. 1, solder bump interconnects 138 of FIG. 2, interconnect pillars 146 of FIG. 3, and the like) per unit area. In a hexagonal arrangement, a single node 150, such as a signal node or a ground node, may be surrounded by up to six (6) neighboring nodes 150, which are substantially equidistant (distance X in dashed lines) from one another, wherein the nodes 150 may represent the microelectronic device vias 106 of FIGS. 1-4. For example, as shown in FIG. 5, a central node $150_0$ may be substantially surrounded by six (6) neighboring nodes labeled as $150_1$ through $150_6$. The distance X is generally as small as possible to reduce the size of the microelectronic device 102. However, due to the proximity of the nodes 150 to one another a significant amount of noise or cross-talk may be coupled from one node 150 interconnect to a neighboring node 150. As will be understood to those skilled in the art, cross-talk is the unintended or undesired capacitive, inductive, or conductive coupling from one circuit, or channel to another, and may be broadly defined as any phenomenon by which a signal transmitted on one circuit or channel of a transmission system creates an undesired effect in another circuit or channel. Cross-talk in high-speed signaling is one of the key issues that may limit signaling speed.

As will be understood to those skilled in the art, most high-speed digital signals are of differential type, i.e. having differential signal pairs. A differential signal pair consists of two separate interconnects (interconnect pins 108 of FIG. 1, solder bump interconnects 138 of FIG. 2, and the like) transmitting the same electrical signal but of different polarity (i.e. positive and negative). The differential signal transmitted is the voltage difference between the two interconnects.

Figure 6:
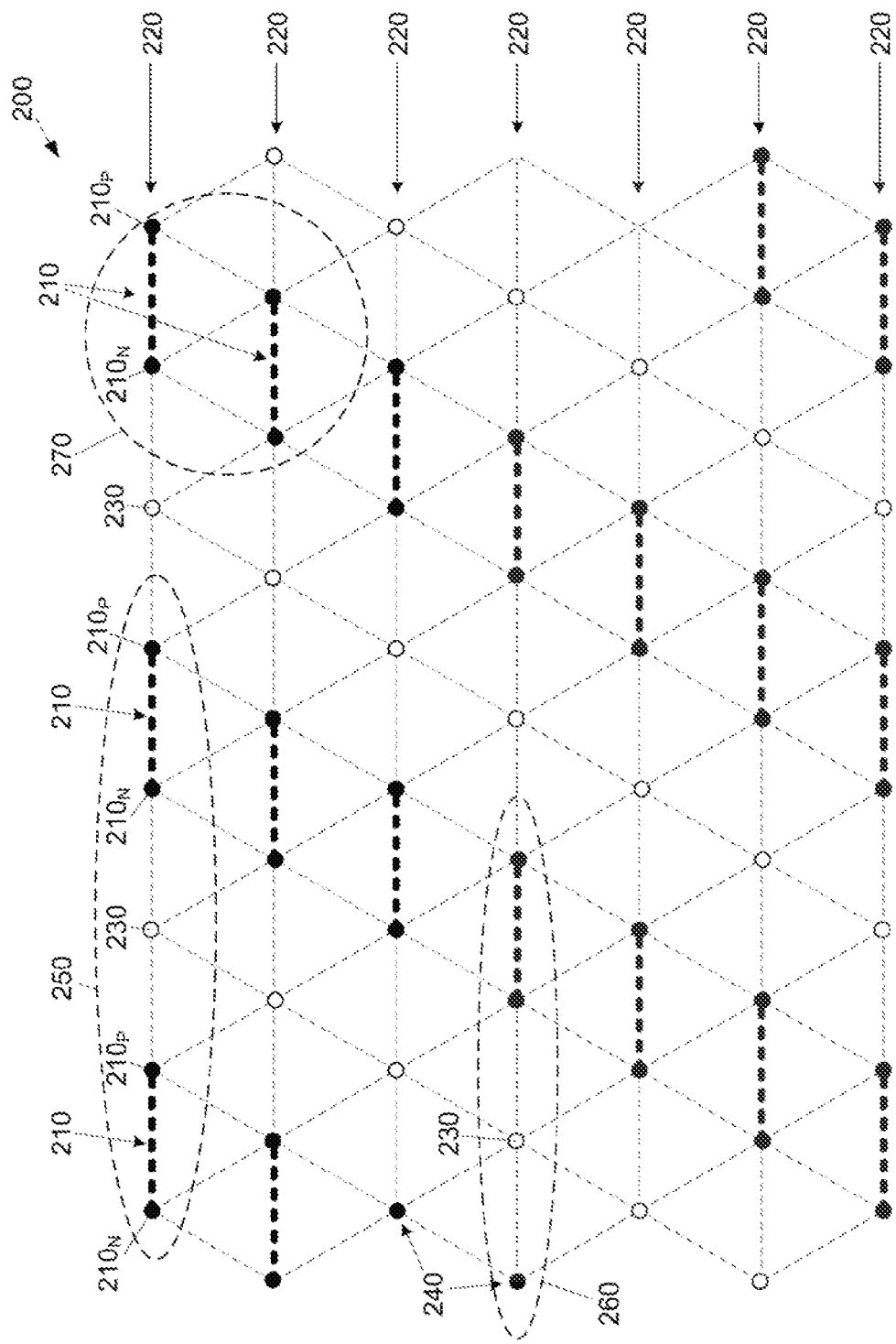
FIG. 6 is a schematic of a hexagonal configuration having a 2:1 signal node to ground node ratio.

FIG. 6 illustrates one hexagonal configuration 200 for minimizing cross-talk. The hexagonal configuration 200 may comprise differential signal node pairs 210 ordered in substantially parallel rows 220 with a ground node 230 (i.e. a node used as common return path that is at ground potential) separating differential signal node pair 210 within each row parallel 220, such as within dashed oval 250. The differential signal node pairs 210 are illustrated as a bold dashed line between two signal nodes $210_N$ (negative signal node) and $210_P$ (positive signal node), but these nodes are not electrically connect with bold dashed line. It is merely illustrative of the appropriate pairs. Thus, the signal node to ground node ratio in the hexagonal configuration 200 is 2:1. Single-end signal nodes 240 may also be present in the microelectronic device 102 (see FIGS. 1-3), and may be separated from a differential signal node pair 210 by one ground node 230, such as shown within dashed oval 260. It is understood that the nodes (e.g. signal and ground nodes) and bold lines illustrated are not structural limitations, but rather are conceptual illustrations to aid in the understanding the mapping for the microelectronic device vias 106 (see FIGS. 1-4), wherein the nodes (i.e. differential pair negative signal nodes $210_N$, differential pair positive nodes $210_P$, single-ended signal nodes 240, and ground nodes 230) correspond to the microelectronic device vias 106 (see FIG. 5). The ground nodes 230 are illustrated as unfilled circles and the signal nodes (e.g. differential pair negative signal nodes $210_N$, differential pair positive signal nodes $210_P$, and single-end signal nodes 240) are filled circles, in order to more conveniently distinguish them from one another. Additionally, for clarity, not all differential signal pairs, differential pair signal nodes, signal-end signal nodes, and/or ground nodes are labeled.

As will be understood to those skilled in the art, the separation of the differential signal node pairs 210 with the ground node 230 within the rows 220 minimizes or substantially eliminates the cross-talk therebetween. Furthermore, as shown in the dash oval 270, the orientation of the differential signal node pairs 210 being substantially parallel between neighboring rows 220 may also minimize or eliminate cross-talk therebetween. Although the hexagonal configuration 200 may be effective in reducing cross-talk, the relatively low signal node to ground node ratio reduces signaling density and may increase the size and cost of the microelectronic device 102 (see FIGS. 1-4).

Figure 7:
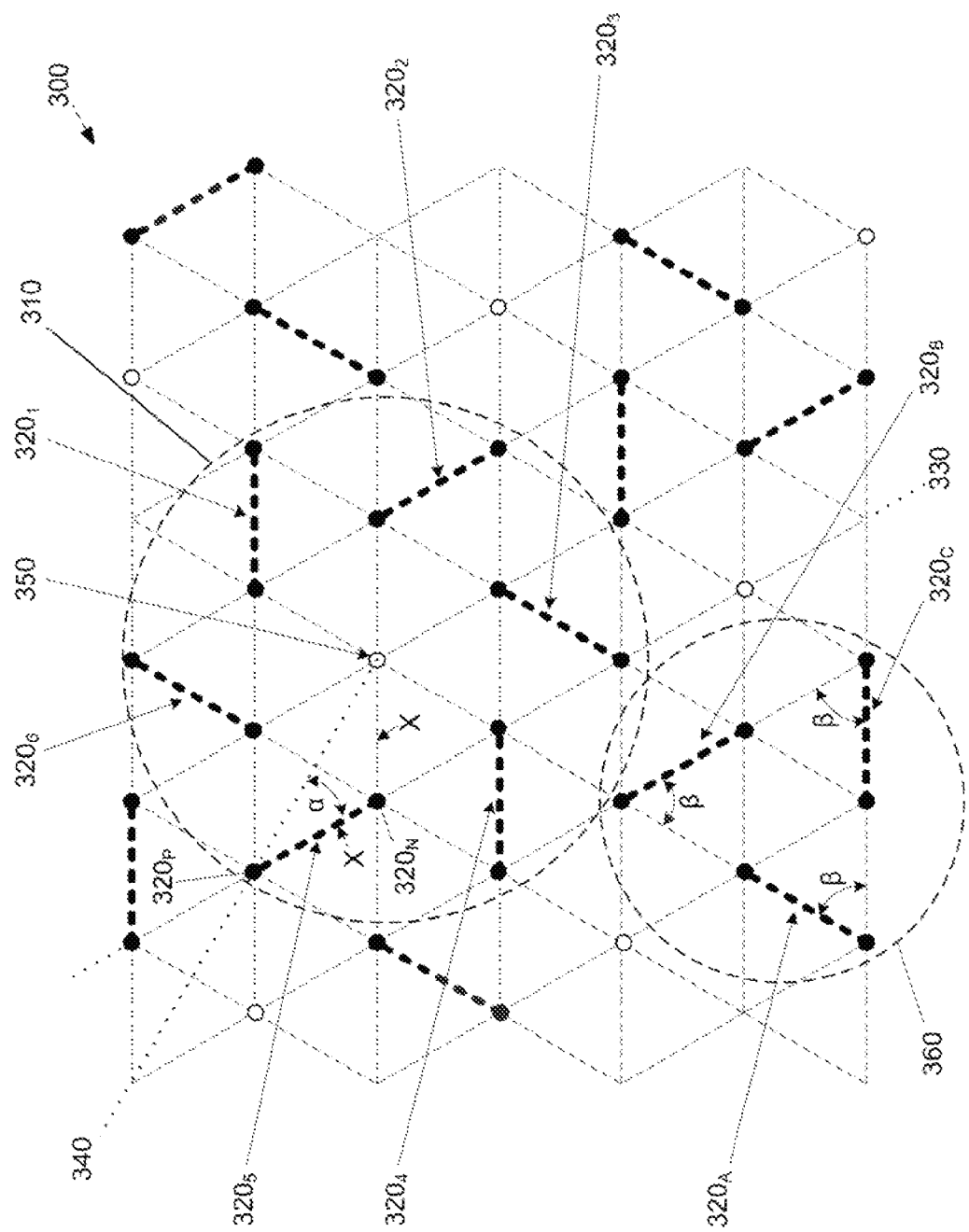
FIG. 7 is a schematic of a hexagonal configuration having a 6:1 signal node to ground node ratio, according to an embodiment of the present description.

Embodiments of the present description, utilizes the cross-talk reduction by cancellation property of geometrically symmetry and orthogonality to increase signal node to ground node ratio, and thereby increasing signaling density. As shown in FIG. 7, one embodiment of the present description comprises a hexagonal node configuration 300 having at least one signal node to ground node ratio of 6:1. At least one 6:1 signal node to ground node ratio arrangement (shown in dashed circle 310) may comprise six (6) differential signal node pairs (illustrated as elements $320_1$ through $320_6$) substantially surrounding a ground node 350. Each differential signal node pair $320_1$ through $320_6$ may have a first signal node (e.g. negative signal node $320_N$) and a second signal node (e.g. positive signal node $320_P$), which are substantially equidistance (e.g. distance X) from one another and defining a line 330 therebetween. The first signal node (e.g. negative signal node $320_N$) may have substantially the same distance X from the ground node 350 and the line 330 defined between the first sinal node (illustrated as negative node $320_N$) and the second node (illustrated as positive signal node $320_P$) may be approximately 30 degrees (illustrated as element α) from a radial line 340 that may be defined to extend from a central ground node 350 through the second node (illustrated as positive node $320_P$). It is understood that this 6:1 signal node to ground node ratio arrangement 310 may extend throughout the entire configuration of the microelectronic device 102 (see FIGS. 1-3). However, it is further understood that it may not be possible or desired to have the 6:1 signal node to ground node ratio arrangement 310 throughout the entire hexagonal node configuration 300. Thus, only partial portions of the 6:1 signal node to ground node ratio arrangement 310 may be present within the entire configuration. Therefore, in one embodiment of the present description, the hexagonal node configuration 300 can be defined as having a signal node to as ground node ratio greater than about 2:1 and less than or equal to 6:1.

The hexagonal configuration 300 may include a differential node pair arrangement 360 (within the dashed circle) comprising three differential node pairs, illustrated as differential node pairs $320_A$, $320_B$, and $320_C$, proximate one another such that each differential node pair is oriented with an angle of approximately 60 degrees (illustrated as element β) from one another (i.e. measured from lines defined between and beyond the respective differential node pairs).

Figure 8:
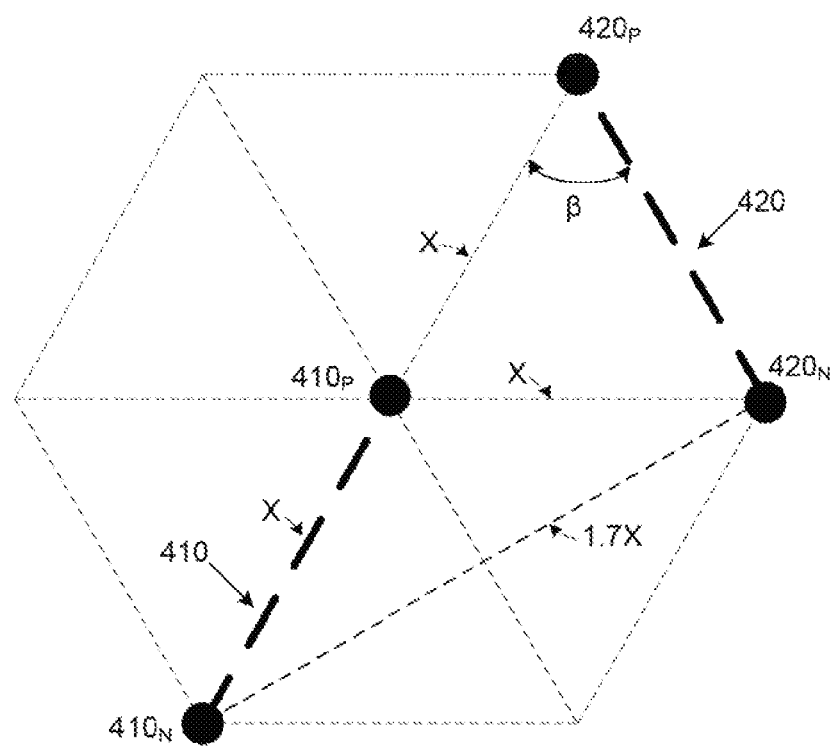
FIG. 8 is a schematic of a hexagonal configuration showing the orientation of differential signal node pairs, according to an embodiment of the present description.

FIG. 8 illustrates the cross-talk reduction principles of the present description. As previously mentioned, the present description may take advantage of orthogonality and symmetry to cancel the cross-talk coming from neighboring differential node pairs. As shown in FIG. 8, the first differential node pair 410 and second differential node pair 420 may have an orientation to one another as described with regard to the embodiment illustrated in FIG. 6. Thus, the first differential node pair 410 would be oriented about 60 degrees (element β) from the second differential node pair 420 (i.e. measured from lines defined between and beyond the respective differential node pairs). As a negative node $420_N$ of the second differential node pair 420 and the positive node $420_P$ of the second differential node pair 420 are both equally located (i.e. distance X) from a positive node $410_P$ of the first differential node pair 410, any cross-talk injection from the second differential node pair 420 (i.e. second differential node pair positive node $420_P$ and second differential node pair negative node $420_N$) to the first differential node pair positive node $410_P$ will be complementary or the same, and will thus be cancelled. In the opposite direction, any cross-talk that may be injected from the first differential node pair positive node $410_P$ to the second differential node pair 420 (i.e. second differential node pair positive node $420_P$ and second differential node pair negative node $420_N$), it will be injected at common voltage (i.e. same magnitude and polarity) and, thus, will be cancelled when a signal of the second differential node pair 420 is read differentially. The same principle will apply at least partially for cross-talk that may be injected from the first differential node pair negative node $410_N$ to the second differential pair 420 (i.e. second differential pair positive node $420_P$ and second differential pair negative node $420_N$), as the distances are not equal (i.e. two times distance X from the first differential node pair negative node $410_N$ to the second differential node pair positive node $420_P$, and about 1.7 times distance X from the first differential node pair negative node $410_N$ to the second differential node pair negative node $420_N$).

Thus, referring back to FIG. 7 for a general configuration, immediately adjacent aggressors (e.g. signal that induces cross-talk to another signal, normally referred as victim) from a plurality of differential node pairs (e.g. differential node pairs $320_1$ through $320_6$) surrounding another individual differential node pair are arranged such that cross-talk is significantly reduced or eliminated. Additionally, a majority of non-immediately adjacent cross-talk aggressors also may be either complete or partially cancelled, as will be understood to those skilled in the art. By way of example, for differential node pair $320_B$, differential node pairs, $320_A$, $320_C$, $320_4$, and $320_3$ would be immediately adjacent node cross-talk aggressors, and differential nodes farther away, such as $320_5$, $320_2$, etc. would be non-immediately adjacent node cross-talk aggressors.

With regard to designing, a hexagonal configuration, the node placement should be as symmetric as possible, as any asymmetry will reduce the effectiveness of crosstalk cancellation. Furthermore, any change in the orientation may change the effectiveness of the configuration. Therefore, if a node cannot be defined as component of a differential node pair, the counterpart node can be defined as ground node to minimize the impact.

It is understood that the subject matter of the present description is not necessarily limited to specific applications illustrated in FIGS. 1-8. The subject matter may be applied to other microelectronic device and assembly applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A device comprising: a plurality of interconnects arranged in a hexagonal node configuration including a plurality of nodes each neighboring a respective other of the plurality of nodes, the plurality of nodes each at substantially a same distance from a respective one or more neighboring nodes of the plurality of nodes, wherein, for each node of the plurality of nodes: the node is: a positive signal node of a respective differential signal node pair; a negative signal node of a respective differential signal node pair; or a ground node; and the node neighbors six other nodes each selected from a respective group consisting of: a positive signal node of a respective differential signal node pair; a negative signal node of a respective differential signal node pair; and a ground node; wherein the plurality of nodes includes: differential signal node pairs each arranged along a respective row of substantially parallel rows of the hexagonal node configuration, the differential signal node pairs including a first differential signal node pair and a second differential signal node pair each in arranged along a first row; and a plurality of ground nodes each in a respective row of substantially parallel rows, wherein each of the plurality of ground nodes is between and neighbors two respective differential signal node pairs arranged in the respective row.

2. A device comprising: a plurality of interconnects arranged in a hexagonal node configuration including a plurality of nodes each neighboring a respective other of the plurality of nodes, wherein, for each node of the plurality of nodes: the node is a positive signal node of a respective differential signal node pair; a negative signal node of a respective differential signal node pair; or a ground node; and the node neighbors six other nodes each selected from a respective group consisting of: a positive signal node of a respective differential signal node pair; a negative signal node of a respective differential signal node pair; and a ground node; wherein the plurality of nodes are arranged to form one or more node groups each consisting of a respective seven nodes including: a respective ground node; and a respective six signal nodes each neighboring the ground node, wherein six differential signal node pairs each include a different respective one of the six signal nodes.

3. The device of claim 2, wherein, the one or more node groups includes a first node group, wherein the six signal nodes of the first node group are positive signal nodes each of a respective differential signal node pair.

4. The device of claim 2, wherein the one or more node groups includes a first node group, wherein the six signal nodes of the first node group are negative signal nodes each of a respective differential signal node pair.

5. The device of claim 2, wherein the plurality of nodes are each at substantially a same distance from a respective neighboring node of the plurality of nodes.

6. An apparatus comprising: a microelectronic substrate; and a microelectronic device electrically attached to the microelectronic substrate with a plurality of interconnects extending from a plurality of vias on a land surface of the microelectronic device, the plurality of interconnects arranged in a hexagonal node configuration including a plurality of nodes each neighboring a respective other of the plurality of nodes, the plurality of nodes each at substantially a same distance from a respective one or more neighboring nodes of the plurality of nodes, wherein, for each node of the plurality of nodes: the node is: a positive signal node of a respective differential signal node pair; a negative signal node of a respective differential signal node pair; or a ground node; and the node neighbors six other nodes each selected from a respective group consisting of: a positive signal node of a respective differential signal node pair; a negative signal node of a respective differential signal node pair; and a ground node; wherein the plurality of nodes includes: differential signal node pairs each arranged along a respective row of substantially parallel rows of the hexagonal node configuration, the differential signal node pairs including a first differential signal node pair and a second differential signal node pair each in arranged along a first row; and a plurality of ground nodes each in a respective row of substantially parallel rows, wherein each of the plurality of ground nodes is between and neighbors two respective differential signal node pairs arranged in the respective row.

7. The apparatus of claim 6, wherein the plurality of interconnects comprise a plurality of interconnect pins inserted into conductive recesses within a microelectronic socket attached to the microelectronic substrate.

8. The apparatus of claim 6, wherein the plurality of interconnects comprise a plurality of solder bump interconnects extending between the microelectronic device vias and vias on an attachment surface of the microelectronic substrate.

9. An apparatus comprising: a microelectronic substrate; and a microelectronic device electrically attached to the microelectronic substrate with a plurality of interconnects extending from a plurality of vias on a land surface of the microelectronic device, the plurality of interconnects arranged in a hexagonal node configuration including a plurality of nodes each neighboring a respective other of the plurality of nodes, the plurality of nodes each at substantially a same distance from a respective neighboring node of the plurality of nodes, wherein, for each node of the plurality of nodes: the node is one of: a positive signal node of a respective differential signal node pair; a negative signal node of a respective differential signal node pair; and a ground node; and the node neighbors six other nodes each selected from a respective group consisting of: a positive signal node of a respective differential signal node pair; a negative signal node of a respective differential signal node pair; and a ground node; wherein the plurality of nodes are arranged to form one or more node groups each consisting of a respective seven nodes including: a respective ground node; and a respective six signal nodes each neighboring the ground node, wherein six differential signal node pairs each include a different respective one of the six signal nodes.

10. The apparatus of claim 9, wherein the one or more node groups includes a first node group, wherein the six signal nodes of the first node group are positive signal nodes each of a respective differential signal node pair.

11. The apparatus of claim 9, wherein the one or more node groups includes a first node group, wherein the six signal nodes of the first node group are negative signal nodes each of a respective differential signal node pair.

12. The apparatus of claim 9, wherein the plurality of nodes are each at substantially a same distance from a respective neighboring node of the plurality of nodes.

* * * * *